United States Patent
Anderson et al.

(10) Patent No.: US 9,275,951 B2
(45) Date of Patent: Mar. 1, 2016

(54) CURVILINEAR WIRING STRUCTURE TO REDUCE AREAS OF HIGH FIELD DENSITY IN AN INTEGRATED CIRCUIT

(71) Applicant: GLOBALFOUNDRIES INC., Grand Cayman (KY)

(72) Inventors: Felix Patrick Anderson, Colchester, VT (US); Thomas Leddy McDevitt, Underhill, VT (US); Anthony Kendall Stamper, Williston, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 48 days.

(21) Appl. No.: 13/945,678

(22) Filed: Jul. 18, 2013

(65) Prior Publication Data
US 2013/0307158 A1    Nov. 21, 2013

Related U.S. Application Data

(63) Continuation of application No. 12/427,775, filed on Apr. 22, 2009, now Pat. No. 8,530,970, which is a continuation-in-part of application No. 12/126,866, filed on May 24, 2008, now Pat. No. 7,538,006.

(51) Int. Cl.
*H01L 21/00* (2006.01)
*H01L 23/528* (2006.01)
(Continued)

(52) U.S. Cl.
CPC ............ *H01L 23/5283* (2013.01); *H01G 4/232* (2013.01); *H01G 4/306* (2013.01); *H01G 4/33* (2013.01); *H01L 21/768* (2013.01);
(Continued)

(58) Field of Classification Search
CPC ............. H01L 23/5283; H01L 21/768; H01L 23/5223; H01L 28/86; H01L 28/90; H01G 4/33; H01G 4/232; H01G 4/306; Y10T 29/49204; Y10T 2924/0002

See application file for complete search history.

(56) References Cited

U.S. PATENT DOCUMENTS

| 2,969,488 A | 1/1961 | Foster et al. |
| 3,035,237 A | 5/1962 | Schlicke |

(Continued)

OTHER PUBLICATIONS

Chen, F., F. Ungar, A.H. Fischer, J. Gill, A. Chinthakindi, T. Goebel, M. Shinosky, D. Coolbaugh, V. Ramachandran, Y. K. Siew, E. Kaltalioglu, S. O. Kim, K. Park, Reliability Characterization of BEOL Vertical Natural Capacitor using Copper and Low-k SiCOH Dielectric for 65nm RF and Mixed-Signal Applications, Reliability Physics Symposium Proceedings, San Jose, CA, 2006. 44th Annual., IEEE International, Published Mar. 2006, pp. 490-495.

(Continued)

*Primary Examiner* — Laura Menz
(74) *Attorney, Agent, or Firm* — Anthony Canale; Andrew M. Calderon; Roberts Mlotkowski Safran & Cole, P.C.

(57) ABSTRACT

A method for reducing areas of high field density in an integrated circuit is disclosed. In one embodiment, the method includes forming a first curvilinear wiring structure in a first interconnect layer of an integrated circuit. A second curvilinear wiring structure may be formed in a second interconnect layer of the integrated circuit, such that the first and second curvilinear wiring structures are substantially vertically aligned. The first curvilinear wiring structure may then be electrically connected to the second curvilinear wiring structure. A corresponding apparatus and design structure are also described.

6 Claims, 8 Drawing Sheets

(51) Int. Cl.
*H01G 4/232* (2006.01)
*H01G 4/30* (2006.01)
*H01G 4/33* (2006.01)
*H01L 23/522* (2006.01)
*H01L 49/02* (2006.01)
*H01L 21/768* (2006.01)

(52) U.S. Cl.
CPC ............ *H01L23/5223* (2013.01); *H01L 28/86* (2013.01); *H01L 28/90* (2013.01); *H01L 2924/0002* (2013.01); *Y10T 29/49204* (2015.01)

(56) References Cited

U.S. PATENT DOCUMENTS

| | | | |
|---|---|---|---|
| 3,163,807 | A | 12/1964 | Linderholm |
| 3,178,799 | A | 4/1965 | Linderholm |
| 3,906,297 | A | 9/1975 | Hunt |
| 4,177,495 | A | 12/1979 | Perret |
| 4,591,947 | A | 5/1986 | Bagley |
| 6,218,230 | B1 | 4/2001 | Fujiwara |
| 6,319,790 | B1 | 11/2001 | Kubota |
| 6,528,838 | B1 | 3/2003 | Ng et al. |
| 6,548,367 | B1 * | 4/2003 | Ng et al. ............ 438/396 |
| 6,619,763 | B2 | 9/2003 | Trinh et al. |
| 6,765,779 | B2 | 7/2004 | Stevenson et al. |
| 6,765,780 | B2 | 7/2004 | Brendel et al. |
| 6,770,930 | B2 | 8/2004 | Oashi |
| 6,774,423 | B2 | 8/2004 | Kubo |
| 6,853,537 | B2 | 2/2005 | Ishii |
| 6,980,414 | B1 * | 12/2005 | Sutardja ............ 361/306.3 |
| 6,985,347 | B2 | 1/2006 | Stevenson et al. |
| 6,987,660 | B2 | 1/2006 | Stevenson et al. |
| 7,015,654 | B1 | 3/2006 | Kuhlmann et al. |
| 7,108,933 | B2 | 9/2006 | Gelsey |
| 7,113,387 | B2 | 9/2006 | Stevenson et al. |
| 7,136,273 | B2 | 11/2006 | Stevenson et al. |
| 7,310,216 | B2 | 12/2007 | Stevenson et al. |
| 7,327,551 | B2 | 2/2008 | Chien et al. |
| 7,327,553 | B2 | 2/2008 | Brendel |
| 7,466,534 | B2 | 12/2008 | Chinthakindi |
| 7,489,495 | B2 | 2/2009 | Stevenson |
| 7,538,006 | B1 | 5/2009 | Anderson et al. |
| 2004/0184220 | A1 | 9/2004 | Ishii |
| 2007/0123185 | A1 | 5/2007 | Welk et al. |
| 2007/0279835 | A1 | 12/2007 | Chinthakindi |
| 2008/0278166 | A1 | 11/2008 | Wosik et al. |
| 2008/0304203 | A1 | 12/2008 | Chinthakindi |
| 2008/0305606 | A1 | 12/2008 | Chinthakindi |
| 2009/0288869 | A1 | 11/2009 | Anderson et al. |

OTHER PUBLICATIONS

Plouchart, Jean-Olivier (IBM Semiconductor Research and Development Center); Zamdmer, Noah; Kim, Jonghae; Trzcinski, Robert; Narasimha, Shreesh; Khare, Mukesh; Wagner, Lawrence F.; Sweeney, Susan L.; Chaloux, Susan , 243-GHz Ft and 208-GHz Fmax, 90-nm SOI CMOS SoC Technology with Low-power mmWave Digital and RF Circuit Capability, IEEE Transactions on Electron Devices, v 52, n 7, Jul. 2005, p. 1370-1375, Publisher: Institute of Electrical and Electronics Engineers Inc.

Notice of Allowance: U.S. Appl. No. 12/126,866, Title: "Annular Damascene Vertical Natural Capacitor", Filing Date: May 24, 2008, Date Mailed: Jan. 23, 2009.

Notice of Allowance: U.S. Appl. No. 12/427,775, Title: "Curvilinear Wiring Structure to Reduce Areas of High Field Density in an Integrated Circuit", Filing Date: Apr. 22, 2009, Date Mailed: May 7, 2013.

\* cited by examiner

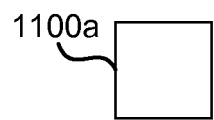
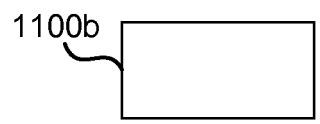
(Prior Art)
Fig. 11A
(Prior Art)
Fig. 11B
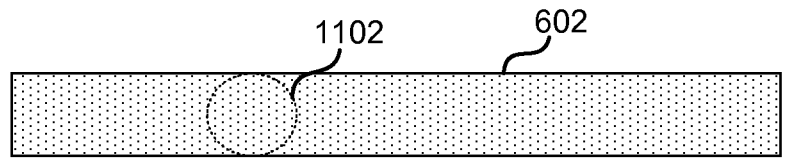
(Prior Art)
Fig. 11C
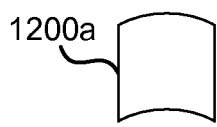
Fig. 12A
Fig. 12B
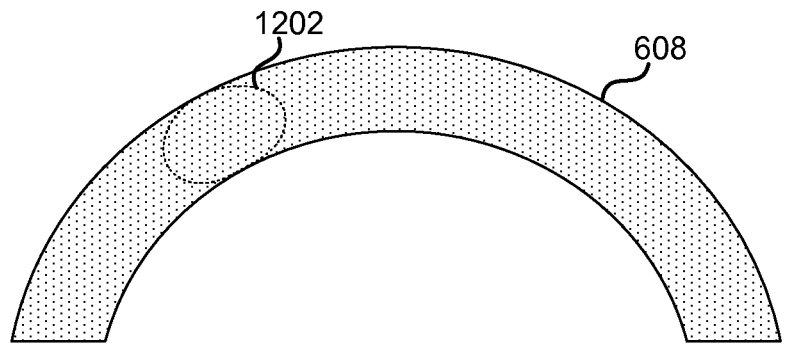
Fig. 12C

CURVILINEAR WIRING STRUCTURE TO REDUCE AREAS OF HIGH FIELD DENSITY IN AN INTEGRATED CIRCUIT

RELATED APPLICATIONS

This application claims priority to and is a continuation of U.S. patent application Ser. No. 12/427,775 filed on Apr. 22, 2009 and entitled "CURVILINEAR WIRING STRUCTURE TO REDUCE AREAS OF HIGH FIELD DENSITY IN AN INTEGRATED CIRCUIT," which is a continuation-in-part of U.S. patent application Ser. No. 12/126,866 filed on May 24, 2008 and entitled "ANNULAR DAMASCENE VERTICAL NATURAL CAPACITOR."

BACKGROUND

1. Field of Invention

This invention relates to wiring structures and design structures in integrated circuits, and more particularly to wiring structures and design structures configured to reduce areas of high field density in integrated circuits.

2. Background of the Invention

Vertical natural capacitors are on-chip capacitors that are incorporated into the interconnect levels of integrated circuits, typically during Back-End-Of-The-Line ("BEOL") processes. Such capacitors may be placed in close proximity to various components on the integrated circuit in order to minimize inductive or resistive losses that may occur when using off-chip capacitors. Vertical natural capacitors may be formed using the same processes that are used to form wiring on integrated circuits, using the native insulator material as the dielectric. Thus, these capacitors may be fabricated without additional mask layers or new films, making these capacitors relatively simple and inexpensive to produce.

Conventional vertical natural capacitors are typically formed as interleaved, comb-like structures in the interconnect levels of the integrated circuit. FIG. 1 shows one example of a conventional vertical natural capacitor 100. In this example, a first comb-like structure 102a, forming a first electrode, interleaves with a second comb-like structure 102b, forming a second electrode. Circles 104 represent potential locations for vias connecting the comb-like structures 102a, 102b to similar or identical structures immediately above or below, thereby forming a stack. FIG. 2 shows a side profile of the vertical natural capacitor 100 showing the stack of comb-like structures 102b and vias 200 interconnecting the structures 102b.

One problem with the rectangular comb-like structures 102a, 102b of FIG. 1, as well as any other rectangular or x-y dimensioned wiring structure, is the corners, edges, or protrusions inherent in such structures. For example, FIG. 1 shows several corners 106 inherent in the comb-like structures 102a, 102b. These corners 106 may create areas of high electric field density which may cause capacitor breakdown, shorting, or current leakage through the dielectric. As will be explained in more detail in association with FIG. 6A, the rectangular configuration may also create areas of high field density when vias protrude from the sides of wires in such structures.

In view of the foregoing, what is needed is a curvilinear wiring structure that is able to reduce areas of high field density, thereby reducing capacitor and other wiring structure breakdown, shorting, and leakage through the dielectric. Ideally, such a wiring structure would be easily incorporated into the interconnect levels of an integrated circuit. Further needed is a conductive via having a cross-sectional shape substantially conforming to a curvilinear shape of a wiring structure, and thereby reduce areas of high field density caused by vias protruding from the sides of wires.

SUMMARY

The invention has been developed in response to the present state of the art and, in particular, in response to the problems and needs in the art that have not yet been fully solved by currently available wiring structures and design structures for integrated circuits. Accordingly, the invention has been developed to provide improved wiring structures and design structures that overcome various limitations of the prior art. The features and advantages of the invention will become more fully apparent from the following description and appended claims, or may be learned by practice of the invention as set forth hereinafter.

Consistent with the foregoing, a method for reducing areas of high field density in an integrated circuit is disclosed herein. In one embodiment, the method includes forming a first curvilinear wiring structure in a first interconnect layer of an integrated circuit. A second curvilinear wiring structure may be formed in a second interconnect layer of the integrated circuit, such that the first and second curvilinear wiring structures are substantially vertically aligned. The first curvilinear wiring structure may then be electrically connected to the second curvilinear wiring structure.

An apparatus for reducing areas of high field density in an integrated circuit is also presented. Embodiments of an apparatus in accordance with the invention may include a first curvilinear wiring structure in a first interconnect layer of an integrated circuit and a second curvilinear wiring structure in a second interconnect layer of the integrated circuit. The second curvilinear wiring structure may be substantially vertically aligned with the first curvilinear wiring structure. An electrical connection may electrically couple the first curvilinear wiring structure to the second curvilinear wiring structure.

A design structure embodied in a machine-readable medium is also presented. The design structure may include a first curvilinear wiring structure in a first interconnect layer of an integrated circuit and a second curvilinear wiring structure in a second interconnect layer of the integrated circuit. The second curvilinear wiring structure may be substantially vertically aligned with the first curvilinear wiring structure, and an electrical connection may couple the first curvilinear wiring structure to the second curvilinear wiring structure.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which:

FIG. 11A is a top view of a conventional mask shape for forming a conductive via;

FIG. 11B is a top view of a second conventional mask shape for forming a conductive via;

FIG. 11C is a top view of a conductive via formed from a conventional mask shape;

FIG. 12A is a top view of one embodiment of a curvilinear mask shape for forming a conductive via in accordance with the invention;

FIG. 12B is a top view of an alternate embodiment of a curvilinear mask shape for forming a conductive via in accordance with the invention;

FIG. 12C is a top view of a conductive via formed from a curvilinear mask shape in accordance with certain embodiments of the present invention;

DETAILED DESCRIPTION

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

Figure 1:
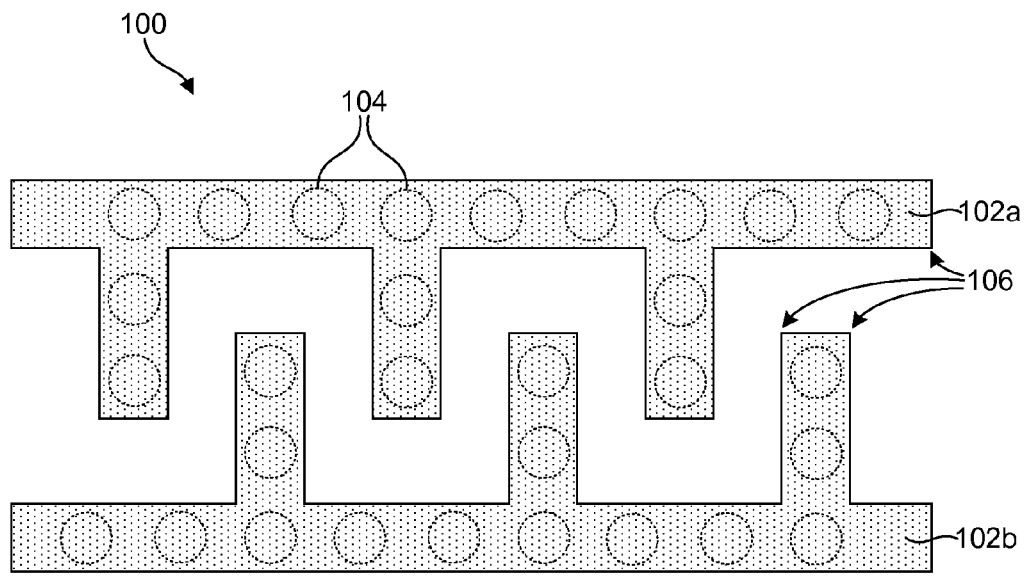
FIG. 1 is a top view of one example of a conventional vertical natural capacitor having interleaving rectangular comb-like structures.
Figure 2:
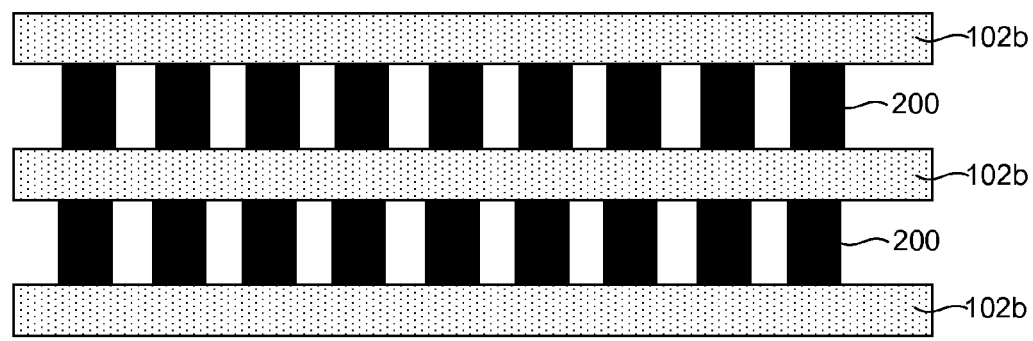
FIG. 2 is a side profile view of the vertical natural capacitor of FIG. 1.
Figure 3:
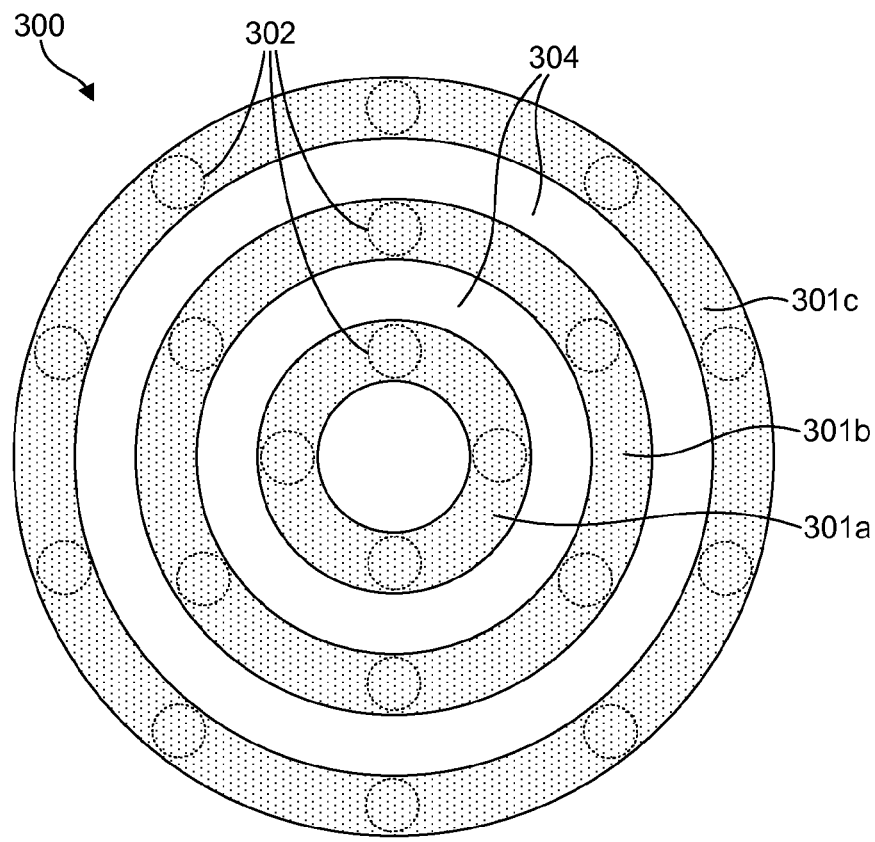
FIG. 3 is a top view of one embodiment of an improved vertical natural capacitor using concentric conductive annular structures, in this example concentric circular structures.

Referring to FIG. 3, in selected embodiments, a vertical natural capacitor in accordance with the invention may eliminate many or all corners, protrusions, or edges which may create areas of high field density within the capacitor. This will ideally reduce capacitor breakdown, shorting, and/or leakage through the dielectric. In selected embodiments, a vertical natural capacitor in accordance with the invention may include multiple concentric conductive annular structures 300 arranged into a stack-like structure within the metal layers (i.e., interconnect layers) of an integrated circuit. These annular structures may be coupled together with conductive vias 302 to form the capacitor. For the purposes of this description, the term "annular" is used to describe any ring-like structure, including, for example, circular, elliptical, spiral, or other rounded structures. In certain embodiments, the ring-like structure may be closed (e.g., continuous) or open (e.g., broken or discontinuous).

For example, in one embodiment, the annular structures 300 may include circular conductive rings 301a-c arranged in the interconnect layers of an integrated circuit. The rings 301a-c may be formed in the same manner as other metal wires in the interconnect layers. In this example, an inner and outer ring 301a, 301c form part of a first electrode of the capacitor, and a center ring 301b forms part of a second electrode of the capacitor.

An insulator material 304 that is native to the interconnect levels of the integrated circuit may provide the dielectric material between the rings 301a-c. In certain embodiments, the inner and outer rings 301a, 301c may be electrically connected together in an interconnect layer (not shown) either above or below the layer 300. In other embodiments, one or more rings, such as the center ring 301b may be broken to provide a path to electrically connect the inner and outer rings 301a, 301c. Although the illustrated annular structure 300 includes three rings 301a-c, fewer or additional rings may be used in the capacitor. For example, a fourth ring (not shown) may encircle the outer ring 301c and be electrically connected to the center ring 301b, thereby forming part of the second electrode.

Figure 4:
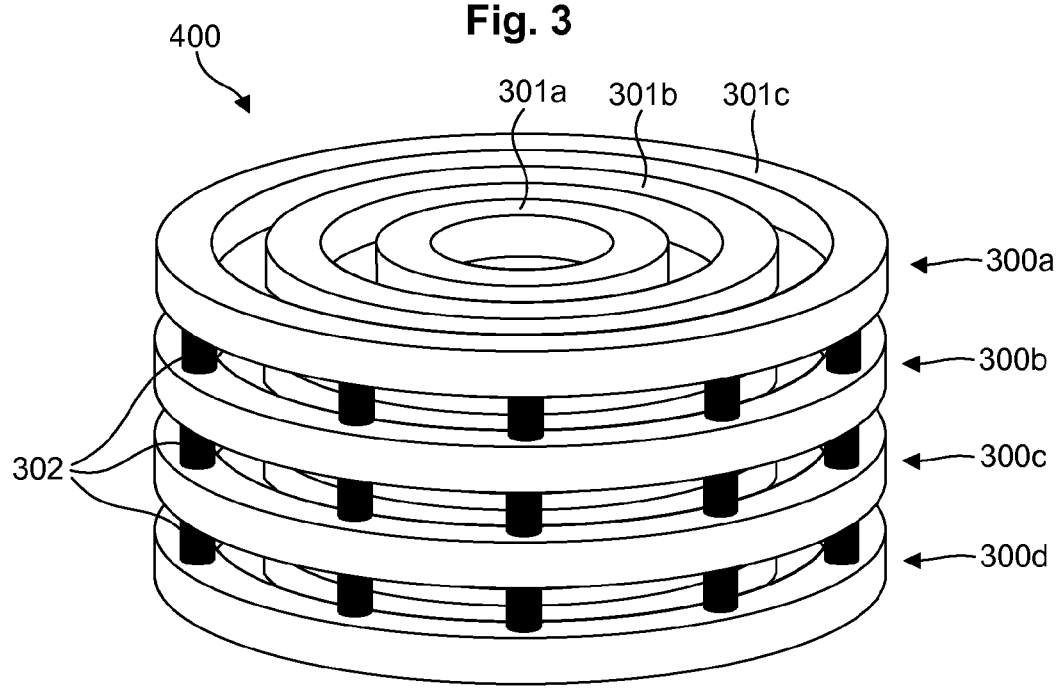
FIG. 4 is a perspective view of the vertical natural capacitor of FIG. 3.

Referring to FIG. 4, a perspective view of one embodiment of a vertical natural capacitor 400 using circular conductive rings 301a-c is illustrated. Here, multiple layers 300a-d of concentric rings 301a-c are stacked in the interconnect layers of an integrated circuit to form the capacitor 400. Vias 302 may connect corresponding rings 301a-c in each layer 300a-d. Although the vertical natural capacitor 400 is shown here to include four layers 300a-d, the vertical natural capacitor 400 is not limited to any number of layers 300a-d.

Figure 5:
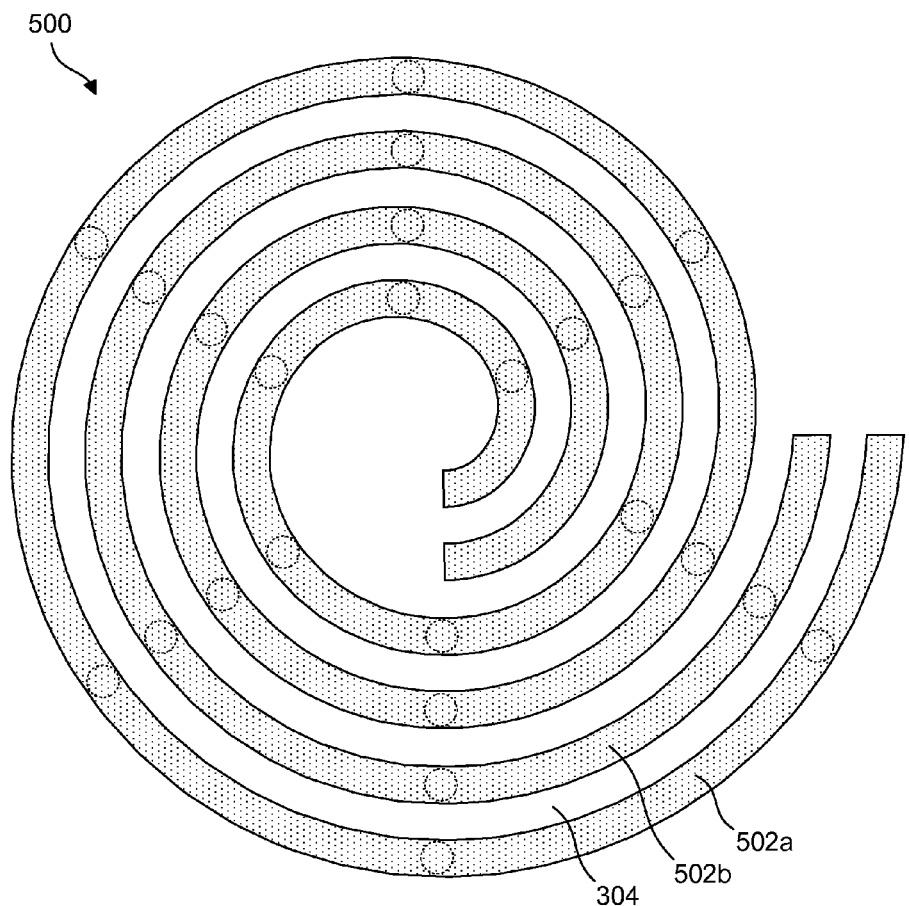
FIG. 5 is a top view of one embodiment of an improved vertical natural capacitor using concentric conductive annular structures, in this example interleaving spiral-shaped structures.

Referring to FIG. 5, in another embodiment, the concentric annular structures 500 may include wires 502a, 502b formed in a spiral shape. Here, the concentric annular structures 500 include two adjacent wires 502a, 502b coiled together in a spiral shape. A first wire 502a may form part of a first electrode of the capacitor and a second wire 502b may form part of a second electrode of the capacitor. A native insulator material 304 may provide a dielectric layer between the wires 502a, 502b. Like the previous example, multiple spiral structures 500 may be stacked and interconnected with vias 302 to form a vertical natural capacitor in accordance with the invention.

Figure 6A:
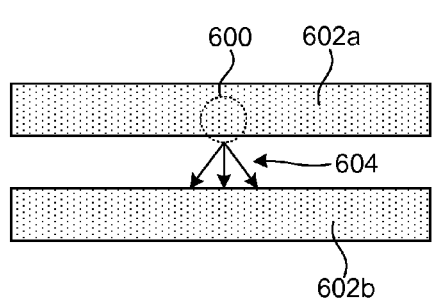
FIG. 6A is a diagram showing the electric field density created by a via protruding from a straight wire.
Figure 6B:
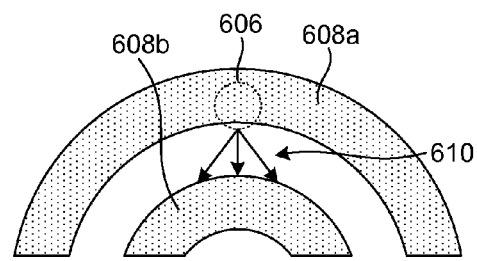
FIG. 6B is a diagram showing the electric field density created by a via protruding from a rounded wire.

Referring to FIGS. 6A and 6B, as previously mentioned, conventional rectangular vertical natural capacitors may generate areas of high field density when vias, which are typically round, protrude from the sides of wires, which are typically straight. Misalignments between the wires and vias may create such protrusions. FIG. 6A shows one example of a via 600 protruding from the side of a straight wire 602a, which is adjacent to another straight wire 602b. FIG. 6B shows an example of a via 606 protruding from the side of a rounded wire 608a, which is adjacent to another rounded wire 608b. Because the strength of the electric field between the vias 600, 606 and the adjacent wires 602b, 608b is directly related to the distance therebetween, the geometry of the wires may play an important role in minimizing or reducing the strength of the electric field.

For example, referring to FIG. 6A, when a via 600 protrudes from the side of a straight wire 602a, the distance between the via 600 and the adjacent wire 602b may be represented by vectors 604. Similarly, when a via 606 protrudes from the side of a rounded wire 608a, the distance between the via 606 and the adjacent rounded wire 608b may be represented by vectors 610. As shown in the drawings, the average distance is greater for the rounded wires 608a, 608b and will thus minimize or reduce the strength of the electric field. This is true where the via 606 protrudes from the inside diameter of the wire 608a. The opposite is true, however, where the via 606 protrudes from the outside diameter of the wire 608a. Thus, in selected embodiments in accordance with the invention, vias 606 may be designed to be slightly off-center with respect to the wire 608a, tending toward the inside diameter or the inside of the arc of curvature of the wire 608a.

The annular capacitor described herein may be formed in any suitable manner known to those of skill in the art of semiconductor manufacturing processes. For example, in selected embodiments, the capacitor may be formed in the interconnect levels of an integrated circuit using a damascene process. In such a process, a dielectric material such as an oxide material may be initially provided on a semiconductor substrate. Patterns may then be etched into the dielectric material. These patterns may be filled with a conductive material such as copper to create the annular conductive patterns described herein. This process may be repeated to create the several layers of the capacitor.

In selected embodiments, patterns that are used to create vias and wires may be created in a multi-step process. For example, in certain embodiments, a first process may include applying a photoresist layer and etching the via patterns into the dielectric material. The photoresist layer may then be removed. A second process may include applying a new photoresist layer and etching the metal-wiring pattern into the dielectric material. This photoresist layer may also be removed. The resulting via and metal-wiring patterns may then be metallized simultaneously (i.e., filled with a metal) to create the conductive structures described herein.

Figure 7:
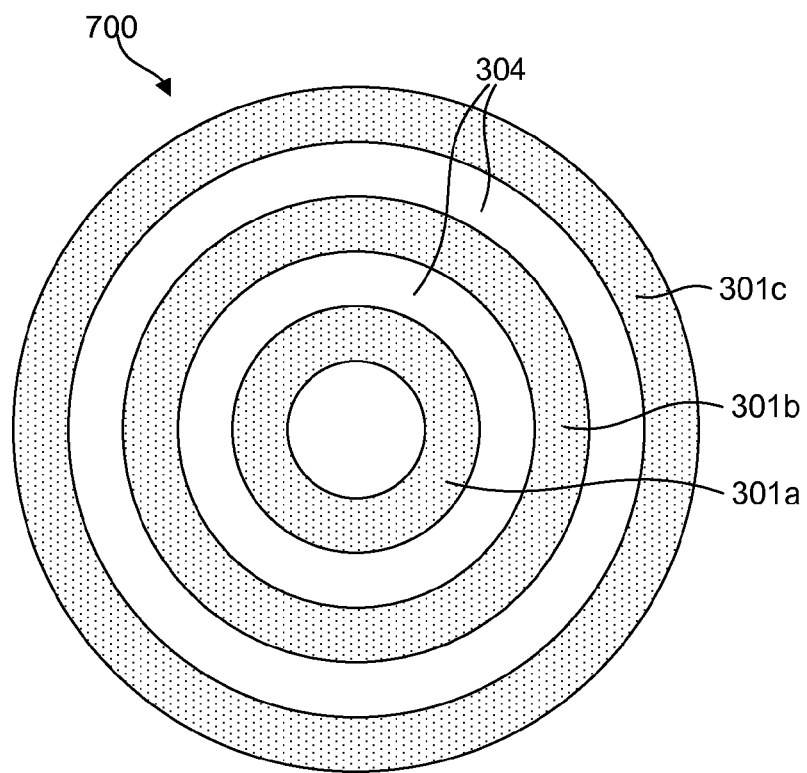
FIG. 7 is a top view of another embodiment of a concentric conductive annular structure in accordance with the invention.
Figure 8:
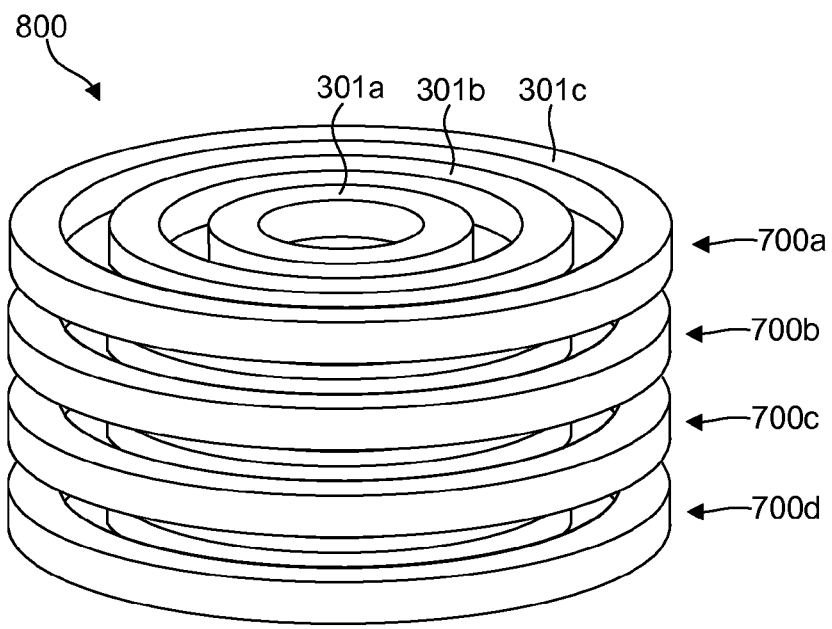
FIG. 8 is a perspective view of an embodiment of a vertical natural capacitor incorporating layers of the concentric conductive annular structure of FIG. 7.

Referring now to FIGS. 7 and 8, in selected embodiments, a curvilinear wiring structure 700 may be formed in an interconnect or metal layer of an integrated circuit. A curvilinear wiring structure 700 may include any wiring structure having at least one annular or curved portion.

In one embodiment, for example, a curvilinear wiring structure 700 may include concentric conductive annular structures 300, such as the circular conductive rings 301a-c described above with reference to FIG. 3. The circular conductive rings 301a-c may be formed in an interconnect level of an integrated circuit using a damascene process, a multi-step process, or any other process known to those in the art. An insulator material 304 may provide a dielectric material between the rings 301a-c. In some embodiments, as discussed above, the insulator material 304 may be native to the integrated circuit.

Referring now to FIG. 8, in certain embodiments, multiple curvilinear wiring structures 700a-d may be stacked to form a vertical natural capacitor 800 in the interconnect layers of an integrated circuit. In this embodiment, an inner and outer ring 301a, 301c may form part of a first electrode of the capacitor 800, while a center ring 301b may form part of a second electrode thereof. As mentioned previously, however, any number of rings 301 and/or layers 700a-d may be used to form a vertical natural capacitor 800 in accordance with embodiments of the present invention.

In one embodiment, the inner and outer rings 301a, 301c may be electrically connected in an interconnect layer (not shown) positioned above or below the curvilinear wiring structure 700. In other embodiments, one or more rings, such as the center ring 301b, may be broken to provide a path to electrically connect the inner and outer rings 301a, 301c in the same interconnect layer.

In some embodiments, the curvilinear wiring structures 700a-d may be vertically stacked in the interconnect layers, such that like parts of a curvilinear wiring structure of one layer 700a-d lie substantially immediately above or below like parts of an adjacent layer 700a-d. In some embodiments, as depicted in FIG. 8, corresponding rings 301a-c in each layer 700a-d may be electrically connected without vias to increase reliability and capacitance.

In some embodiments, for example, wires and/or vias (not shown) may connect corresponding rings 301a-c or features in each layer 700a-d at a position peripheral to the vertical natural capacitor 800 or other main body of the curvilinear wiring structure 700. In other embodiments, layers 700a-d may be stacked to directly contact adjacent layers 700a-d.

Figure 9:
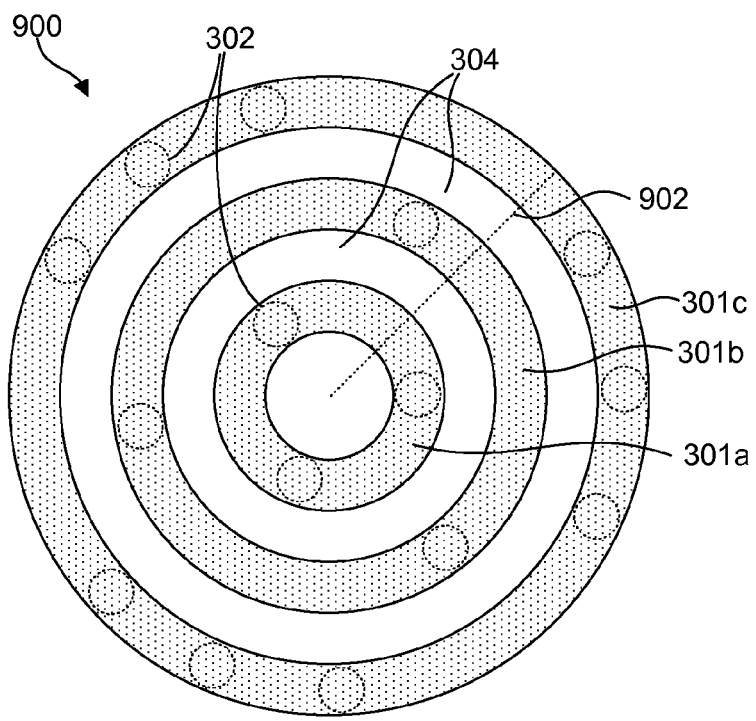
FIG. 9 is a top view of one embodiment of a vertical natural capacitor incorporating conductive vias in a staggered arrangement.
Figure 10:
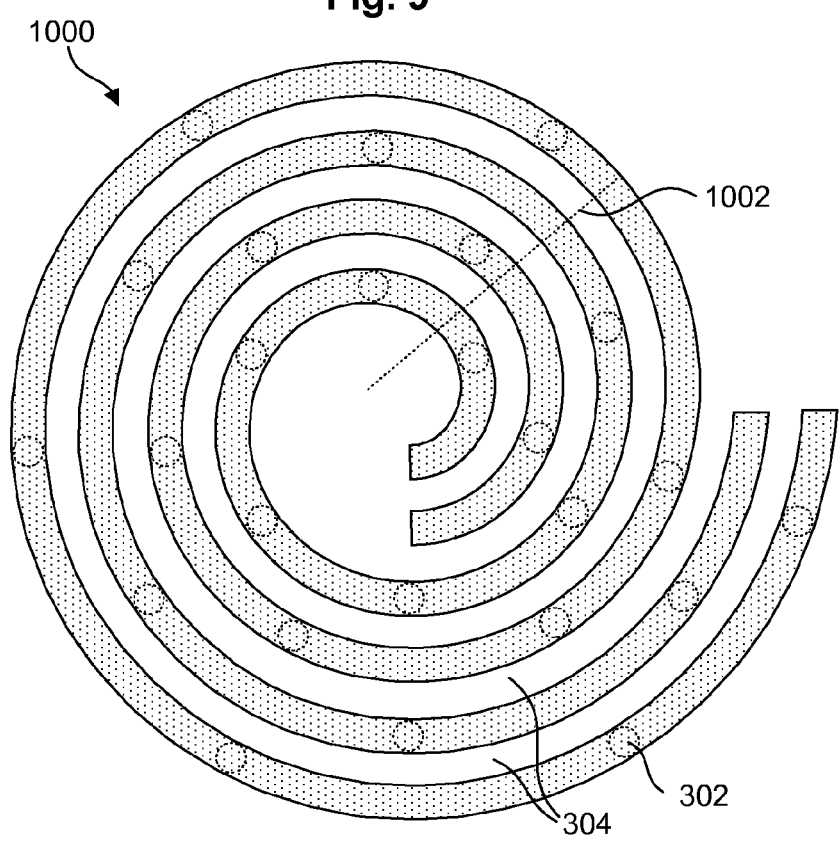
FIG. 10 is a top view of another embodiment of a vertical natural capacitor incorporating conductive vias in a staggered arrangement, in this example interleaving spiral-shaped structures.

Referring now to FIGS. 9 and 10, in some embodiments, a curvilinear wiring structure 700 may include concentric conductive annular structures 300, such as the circular structure 900 depicted in FIG. 9, or the spiral-like structure 1000 depicted in FIG. 10. In any case, the curvilinear wiring structure 700 may include a radius 902, 1002 extending from the center of the structure 700 to a perimeter thereof. As in the previous example, multiple curvilinear wiring structures 700, such as the circular structure 900 and spiral-like structure 1000 shown, may be vertically stacked in adjacent interconnect levels to form a vertical natural capacitor 800. Vias 302 may or may not electrically connect corresponding features of the structures 700.

In some embodiments, vias 302 may be integrated between corresponding features of the curvilinear wiring structures 700a-d using damascene or multi-step processes, or by any other process or method known to those in the art.

In some embodiments, vias 302 may be strategically positioned to minimize a likelihood that protruding vias 302 may produce increased electric field forces. Specifically, a via 302 in one 301a of multiple substantially concentric wires 301a-c may be offset with respect to a via 302 in an adjacent wire 301b, ie. substantially staggered with respect to a radius 902, 1002 of the structure 700. This offset relationship may increase a distance between vias 302 in adjacent concentric wires 301a-c.

Staggering vias 302 in this manner may thus prevent an increased electric field caused by radially adjacent vias 302 protruding in opposite directions from their respective wires 301a-c, such as where one via protrudes from an inside diameter of a wire 301a-c and a radially adjacent via 302 protrudes from an outside diameter of a wire 301a-c. In other embodiments, however, vias 302 may be positioned such that adjacent vias 302 are substantially aligned along a radius 902, 1002 of the curvilinear wiring structure 700.

Referring now to FIGS. 11A, 11B, and 11C, conventional via 302 fabrication processes require patterning a mask to include cutout shapes substantially corresponding to a desired cross-sectional profile 1102 of a via 302. Cutout shapes may be polygonal, typically square 1100a or rectangular, 1100b to substantially match traditional routing and wire geometries.

Resulting via cross-sectional shapes 1102, however, may be substantially rounded relative to their corresponding mask cutout shapes due to lithographic and other formation techniques. Indeed, a square 1100a mask cutout shape may result in a via 302 having a substantially circular cross-sectional profile 1102, while a rectangular 1100b mask cutout shape may be used to produce a via 302 having a substantially elliptical or oval-shaped cross-sectional profile 1102.

Conventional mask cutout shapes, however, tend to produce vias 302 that are ill-suited for curvilinear wire geometries. Particularly, vias 302 resulting from such conventional formation processes are more prone to protrude from sides of curved wires 608 than from straight wires 602.

Referring now to FIGS. 12A, 12B, and 12C, via 302 fabrication processes in accordance with certain embodiments of the present invention may include patterning a mask to include substantially curvilinear cutout shapes 1200a, 1200b for via 302 formation. Particularly, the curvilinear cutout shapes 1200a, 1200b may be selected to substantially correspond to the geometry of a particular curvilinear wiring structure 700. In this manner, an area of the via 302 may be kept substantially constant, while a resulting via cross-sectional profile 1202 may better conform to the geometry of a curved portion 608 of the curvilinear wiring structure 700.

Mask patterning processes, however, may limit the smoothness of a curve incorporated into a mask cutout shape. In some embodiments, for example, mask patterning processes utilize square blocks as sub-units to approximate a desired cutout shape. As a result, a desired curvilinear cutout shape 1200a, 1200b may include a stepped or otherwise rough or uneven pattern approximating a curved edge.

Figure 13:
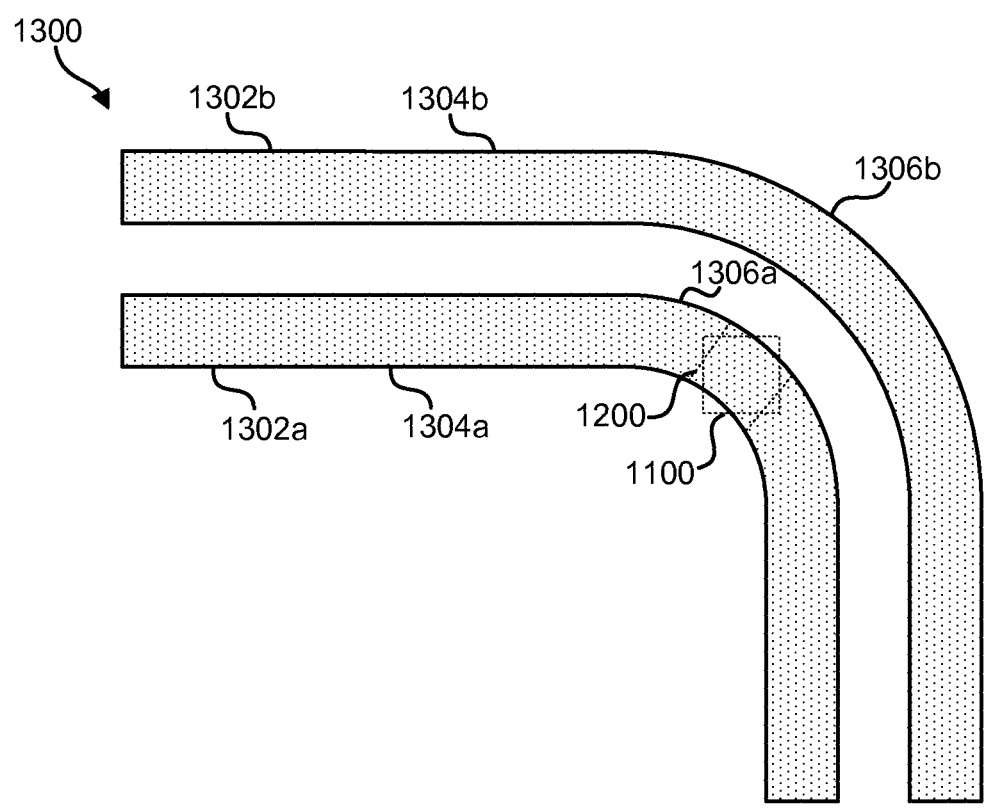
FIG. 13 is a top view of a curvilinear wiring structure having both a conventional mask shape and a curvilinear mask shape for forming a conductive via overlaid thereon.

Referring now to FIG. 13, in certain embodiments, a curvilinear wiring structure 1300 in accordance with the present invention may include one or more substantially parallel wires 1302a, 1302b with straight portions 1304a, 1304b and curved portions 1306a, 1306b. As in prior embodiments, multiple curvilinear wiring structures 1300 may be integrated into adjacent interconnect layers of an integrated circuit, where corresponding features may be substantially vertically aligned. In other embodiments, a curvilinear wiring structure 1300 may be integrated into a single interconnect layer, and may substantially overlie or underlie another wire or wiring structure.

In any case, a via 302 may be positioned to extend from a curved portion 1306a, 1306b of a wire 1302a, 1302b to connect the curvilinear wiring structure 1300 to a subjacent or overlying wire or wiring structure. As discussed above with reference to FIGS. 11A-C and 12A-C, a conventional quadrilateral or polygonal-shaped mask cutout 1100 may result in a via 302 having a cross-sectional profile 1102 that projects from the curvilinear geometry of the wire 1302a, 1302b, thus increasing an electric field density between it and an adjacent wire.

To avoid this result, some embodiments of the present invention include utilizing a curvilinear mask cutout 1200 for via 302 formation. As shown in FIG. 13, the curvilinear mask cutout 1200 may be selected to substantially match the geometry of a curved portion 1306a of a wire 1302a. A resulting via 302 may thus have a cross-sectional profile 1202 substantially conforming to the width and curve of the wire 1302a. In this manner, a curvilinear mask cutout 1200 in accordance with embodiments of the present invention may reduce electric field forces between a via 302 and an adjacent wire.

In some embodiments, a cross-sectional profile 1202 of a via 302 may vary along a length thereof, such that each end of the via 302 substantially conforms to a geometry of a wire at its point of contact.

Figure 14:
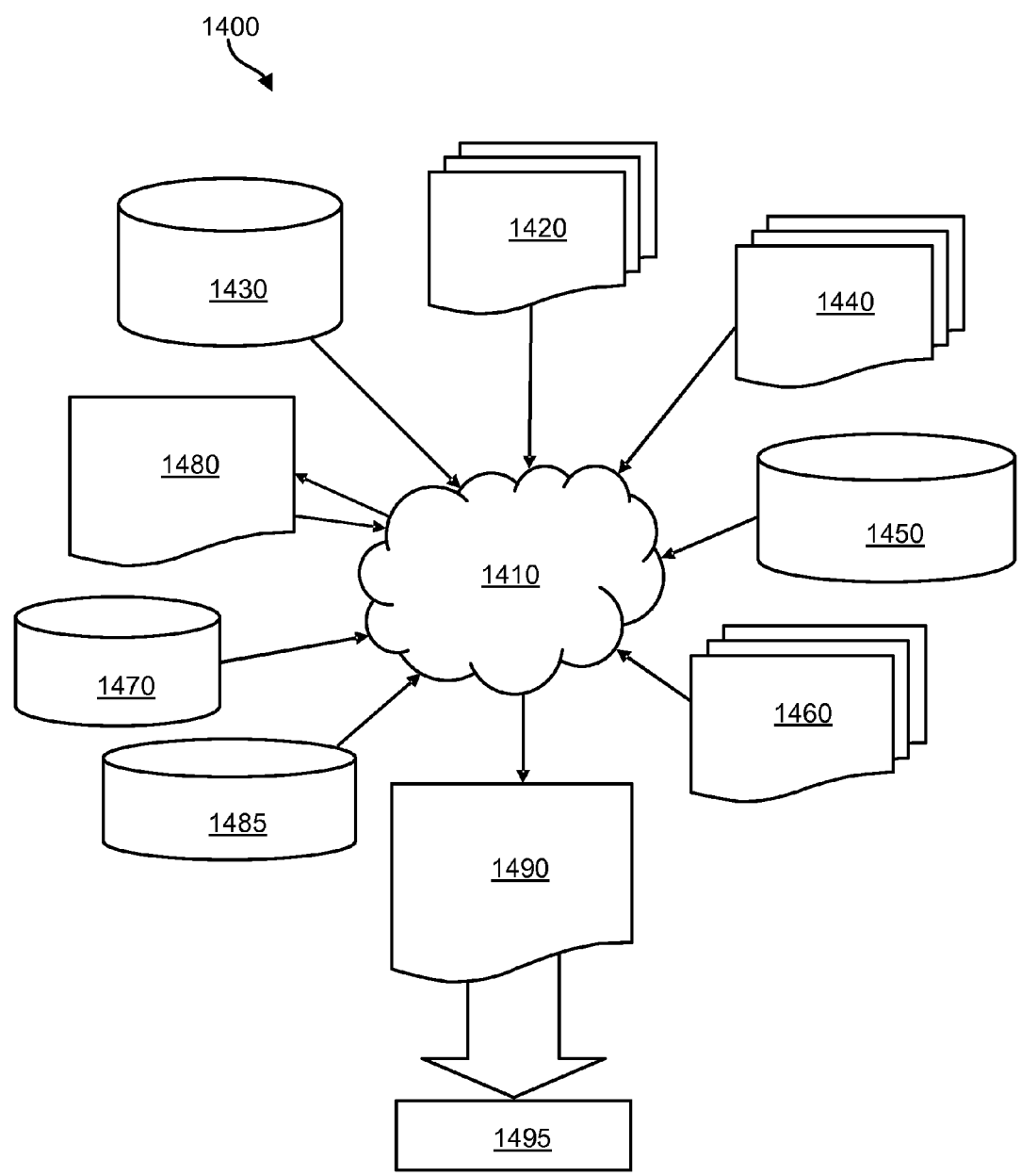
FIG. 14 is a flow diagram of a design process used in semiconductor design, manufacture, and/or test.

FIG. 14 shows a block diagram of an exemplary design flow 1400 used, for example, in semiconductor design, manufacturing, and/or test. Design flow 1400 may vary depending on the type of IC being designed. For example, a design flow 1400 for building an application specific IC (ASIC) may differ from a design flow 1400 for designing a standard component. Design structure 1420 is preferably an input to a design process 1410 and may come from an IP provider, a core developer, or other design company or may be generated by the operator of the design flow, or from other sources. Design structure 1420 may include an embodiment of the invention as shown in FIGS. 3 through 5 in the form of schematics or HDL, a hardware-description language (e.g., Verilog, VHDL, C, etc.). Design structure 1420 may be contained or stored on one or more machine-readable medium.

For example, design structure 1420 may be a text file or a graphical representation of an embodiment of the invention as shown in FIGS. 3 through 5. Design process 1410 preferably synthesizes (or translates) an embodiment of the invention as shown in FIGS. 3 through 5 into a netlist 1480, where netlist 1480 is, for example, a list of wires, transistors, logic gates, control circuits, I/O, models, or the like that describes the connections to other elements and circuits in an IC design and is recorded on at least one machine-readable medium. For example, the medium may be a CD, a compact flash, other flash memory, a packet of data to be sent via the Internet, or other networking suitable means. The synthesis may be an iterative process in which netlist 1480 is resynthesized one or more times depending on design specifications and parameters for the circuit.

Design process 1410 may include using a variety of inputs; for example, inputs from library elements 1430 which may house a set of commonly used elements, circuits, and devices, including models, layouts, and symbolic representations for a given manufacturing technology (e.g., different technology nodes, 32 nm, 45 nm, 90 nm, etc.), design specifications 1440, characterization data 1450, verification data 1460, design rules 1470, and test data files 1485 (which may include test patterns and other testing information). Design process 1410 may further include, for example, standard circuit design processes such as timing analysis, verification, design rule checking, place and route operations, or the like. One of ordinary skill in the art of IC design can appreciate the extent of possible electronic design automation tools and applications used in design process 1410 without deviating from the scope and spirit of the invention. The design structure of the invention is not limited to any specific design flow.

Design process 1410 may translate an embodiment of the invention as shown in FIGS. 3 through 5, along with any additional IC design or data (if applicable), into a second design structure 1490. Design structure 1490 may reside on a storage medium in a data format used for the exchange of layout data of ICs and/or symbolic data format (e.g. information stored in a GDSII (GDS2), GL1, OASIS, map files, or any other suitable format for storing such design structures). Design structure 1490 may include information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 3 through 5. Design structure 1490 may then proceed to a stage 1495 where, for example, design structure 1490 proceeds to tape-out, is released to manufacturing, is released to a mask house, is sent to another design house, is sent back to the customer, or the like.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A method for reducing areas of high field density in an integrated circuit, the method comprising:

forming a first curvilinear wiring structure in a first interconnect layer of an integrated circuit, wherein forming the first curvilinear wiring structure comprises forming a first set of concentric conductive annular structures having a first electrode and a second electrode;

forming a second curvilinear wiring structure in a second interconnect layer of the integrated circuit, wherein the second curvilinear wiring structure is substantially vertically aligned with the first curvilinear wiring structure; and electrically connecting the first curvilinear wiring structure to the second curvilinear wiring structure, wherein electrically connecting the first curvilinear wiring structure to the second curvilinear wiring structure comprises:

forming a curvilinear conductive via to electrically connect the first curvilinear wiring structure to the second curvilinear wiring structure; and extending the curvilinear conductive via between the first curvilinear wiring structure and the second curvilinear wiring structure.

2. The method of claim 1, wherein forming the second curvilinear wiring structure comprises forming a second set of concentric conductive annular structures having a first electrode and a second electrode.

3. The method of claim 2, wherein extending the curvilinear conductive via between the first curvilinear wiring structure and the second curvilinear wiring structure comprises extending a first curvilinear conductive via between the first electrode of the first set and the first electrode of the second set, and extending a second curvilinear conductive via between the second electrode of the first set and the second electrode of the second set.

4. The method of claim 3, further comprising positioning the first curvilinear conductive via substantially adjacent to the second curvilinear conductive via along a radius of at least one of the first and second sets of concentric conductive annular structures.

5. The method of claim 3, further comprising staggering a position of the first curvilinear conductive via relative to the second curvilinear conductive via, such that the first curvilinear conductive via is substantially adjacent and radially offset from the second curvilinear conductive via.

6. The method of claim 1, wherein forming the curvilinear conductive via comprises shaping a cross-section of the curvilinear conductive via to substantially conform to a curvilinear shape of at least one of the first and second curvilinear wiring structures.

* * * * *